(12) United States Patent
Wiens et al.

(10) Patent No.: US 9,221,678 B2
(45) Date of Patent: Dec. 29, 2015

(54) ACTIVE FIXTURING FOR MICRO/MESOSCALE, MACHINE TOOL SYSTEMS

(75) Inventors: Gloria Jean Wiens, Newberry, FL (US); Koustubh Jayaprakash Rao, Ridgewood, NJ (US); Troy Benjamin Rippere, Gainesville, FL (US)

(73) Assignee: University of Florida Research Foundation, Inc., Gainesville, FL (US)

( * ) Notice: Subject to any disclaimer, the term of this patent is extended or adjusted under 35 U.S.C. 154(b) by 1050 days.

(21) Appl. No.: 13/122,776

(22) PCT Filed: Oct. 6, 2009

(86) PCT No.: PCT/US2009/059679
§ 371 (c)(1),
(2), (4) Date: Apr. 6, 2011

(87) PCT Pub. No.: WO2010/042502
PCT Pub. Date: Apr. 15, 2010

(65) Prior Publication Data
US 2011/0193281 A1    Aug. 11, 2011

Related U.S. Application Data

(60) Provisional application No. 61/102,916, filed on Oct. 6, 2008.

(51) Int. Cl.
*B81C 99/00* (2010.01)
(52) U.S. Cl.
CPC ......... *B81C 99/002* (2013.01); *B81B 2201/038* (2013.01); *B81C 2203/058* (2013.01)

(58) Field of Classification Search
CPC ............ B25B 1/06; B25B 5/06; H01L 21/687
USPC ............... 269/118, 109, 111, 75, 912, 254 R; 29/428, 559
See application file for complete search history.

(56) References Cited

U.S. PATENT DOCUMENTS 1,948,799 A * 2/1934 Oyster ............................ 269/32
2,395,242 A * 2/1946 Anderson ...................... 269/203
(Continued)

OTHER PUBLICATIONS

Patent Cooperation Treaty, International Search Report, International Application No. PCT/US2009/059679, May 18, 2010, 4 pages.

*Primary Examiner* — Lee D Wilson
*Assistant Examiner* — Jamal Daniel
(74) *Attorney, Agent, or Firm* — MH2 Technology Law Group, LLP

(57) ABSTRACT

Embodiments generally relate to fixturing devices for supporting a workpiece, the devices including modularized cantilevered and fixed beam fixing elements. Each module includes a compliant beam and an interface element in contact with the workpiece and a portion of the compliant beam for transmitting a contact force between the workpiece and the beam. Dynamic adaptability of the beam is configured by selectively varying beam stiffness by varying either beam length or beam width. Varying a width can include varying a beam width, and/or breadth. In a further embodiment, the compliant beam fixed at both ends is slidable in a longitudinal direction of the beam such that a portion of the interface element slides along the beam, thus dynamically adapting the beam stiffness according to a force applied to a workpiece.

9 Claims, 16 Drawing Sheets

(56) References Cited

U.S. PATENT DOCUMENTS

| | | | |
|---|---|---|---|
| 2,815,566 A * | 12/1957 | Hille | 269/111 |
| 3,452,976 A * | 7/1969 | Ross | 269/91 |
| 5,080,336 A * | 1/1992 | Carossino | 269/93 |
| 5,316,586 A * | 5/1994 | Hoenk et al. | 118/728 |
| 5,458,322 A * | 10/1995 | Kulkaski et al. | 269/254 R |
| 6,287,385 B1 * | 9/2001 | Kroneberger | 118/503 |
| 8,485,511 B2 * | 7/2013 | Di Stefano | 269/303 |
| 8,550,443 B1 * | 10/2013 | Di Stefano | 269/303 |
| 8,979,086 B2 * | 3/2015 | Phillips | 269/134 |
| 2003/0208888 A1 | 11/2003 | Fearing et al. | |
| 2004/0074205 A1 | 4/2004 | Stache | |
| 2004/0088043 A1 | 5/2004 | Klein | |
| 2004/0126895 A1 | 7/2004 | Overbeck et al. | |
| 2007/0207186 A1 | 9/2007 | Scanlon et al. | |
| 2008/0095021 A1 | 4/2008 | Gidon | |
| 2012/0103149 A1 * | 5/2012 | Rexwinkle et al. | 82/1.11 |
| 2012/0146276 A1 * | 6/2012 | McCracken et al. | 269/254 R |
| 2013/0140750 A1 * | 6/2013 | Allred et al. | 269/249 |
| 2014/0239569 A1 * | 8/2014 | Merte et al. | 269/134 |

\* cited by examiner ($k_{min}$/Eb) for Figures 4A, 4B, 7 versus [$r,s$]

($k_{max}$ /Eb) for: Figures 4A, 4B versus [r,s]

($k_{max}$/Eb) for: Figures 4A, 4B versus [r,s]

($\Delta k / Eb$) x $10^{-5}$ for; Figures 4A, 4B versus [$r,s$]

($\Delta k / Eb$) x $10^{-5}$ for; Figures 7 versus [r,s]

(Average Slope of k/Eb) x $10^{-4}$ for Fig. 4A versus [r,s]

(Average Slope of k/Eb) x $10^{-3}$ for Fig. 4B versus [r,s]

(Average Slope of k/Eb) x $10^{-5}$ for Fig. 7 versus [r,s]

ACTIVE FIXTURING FOR MICRO/MESOSCALE, MACHINE TOOL SYSTEMS

CROSS-REFERENCE TO RELATED APPLICATION

This application claims priority to U.S. Provisional Patent Application Ser. No. 61/102,916 filed on Oct. 6, 2008, the disclosure of which is incorporated by reference herein, in its entirety.

FIELD

This invention relates generally to active (dynamic) fixturing, more particularly, to systems and methods for enabling repeatable, ultra-precision mesoscale machining with a mesoscale machine tool component capable of fixturing and manipulating micro/mesoscale workpieces, ranging in size from several microns to several millimeters.

DESCRIPTION OF THE RELATED ART

A growing trend toward miniaturization has impacted technologies in virtually every field, from medicine to manufacturing. Consequently, a dramatic shift is occurring within the manufacturing paradigm toward the development of complementary capabilities for producing miniaturized products and for handling, for example, either machine workpieces or biological entities such as cells and tissues. This has led to the creation of mesoscale machine tools (mMTs) that are less expensive and more portable than conventional precision machine tools. Furthermore, this shift has led to research efforts on multiscale (micro/meso) levels, bridging the gap between the micro and macro worlds and addressing the limitations of the MEMS and lithographic technologies. However, amongst the rapidly growing mesoscale manufacturing research and development, limited research has been pursued in addressing the fixturing and material handling challenges in the creation of micron features on micro and macro parts, or the provision of a microscopic friendly instrumentation for the handling and manipulation of biological entities. A six-axis reconfigurable nano-manipulator consisting of compliant elements and actuators for precision part positioning is known. With the known six-axis type of device, the micro and nano positioners typically position and manipulate components that are adhered to the device or to a much larger interface plate or base material. However, because known devices are hampered by relative variability in tolerances, temperature variations impacting more than the tool-workpiece interface, and uncertainties in the process and constraint loads, fixturing remains a critical issue impeding the integration and autonomous operation of mesoscale manufacturing systems.

Accordingly, exemplary embodiments herein focus on various configurations of fixture elements (fixels) with mechanically adjustable characteristics, critical for active fixturing, i.e. holding, supporting and/or otherwise manipulating a workpiece. This active (dynamic) fixturing approach enhances the repeatability and precision of mesoscale machine tools and their dynamic performance.

SUMMARY

An embodiment relates generally to a fixturing device for supporting a workpiece. The fixturing device includes a plurality of modules, each module comprising—a compliant cantilevered beam, the beam comprising a base end and a free end, and a selectively adjustable length; a positioning device, provided at the base end, for adjusting the contact force between the beam and the workpiece; and an interface element in contact with the workpiece and the free end of the beam for transmitting a contact force between the workpiece and the free end of the beam; wherein mechanical adaptability of the cantilevered beam is configured by selectively varying beam stiffness by varying beam length.

A further embodiment relates generally to a device for supporting a workpiece. The device includes a plurality of modules, each module comprising—a compliant cantilevered beam, the beam comprising a base end, a free end and selectively variable parameters including at least one of width and breadth; a positioning device, provided at the base end, for adjusting the contact force between the beam and the workpiece; and an interface element in contact with the workpiece and the free end of the beam for transmitting a contact force between the workpiece and the free end of the beam; wherein mechanical adaptability of the cantilevered beam is configured by selectively varying beam stiffness by varying said parameters of beam width and breadth.

Yet another embodiment pertains generally to a device for supporting a workpiece. The device includes a plurality of modules, each module comprising—a compliant beam fixed at opposing ends thereof to a movable support; and an interface element having a first portion in contact with the workpiece and a second portion in contact with the beam at a selected position along a length thereof, the interface element transmitting a contact force between the workpiece and the beam according to a position of the interface element on the beam.

A still further embodiment pertains generally to a fixturing device for supporting a workpiece. The fixturing device includes a plurality of modules, each module comprising—a monolithic equivalent of a compliant four beam mechanism, one portion of the mechanism in working contact with the workpiece; and a force sensitive interface element provided intermediate the workpiece and mechanism; wherein a force applied to the workpiece is maintained by the monolithic equivalent of a compliant four beam mechanism without compromising a working position of the workpiece.

BRIEF DESCRIPTION OF THE DRAWINGS

Various features of the embodiments can be more fully appreciated, as the same become better understood with reference to the following detailed description of the embodiments when considered in connection with the accompanying figures, in which.

DETAILED DESCRIPTION OF EMBODIMENTS

Figure 1:
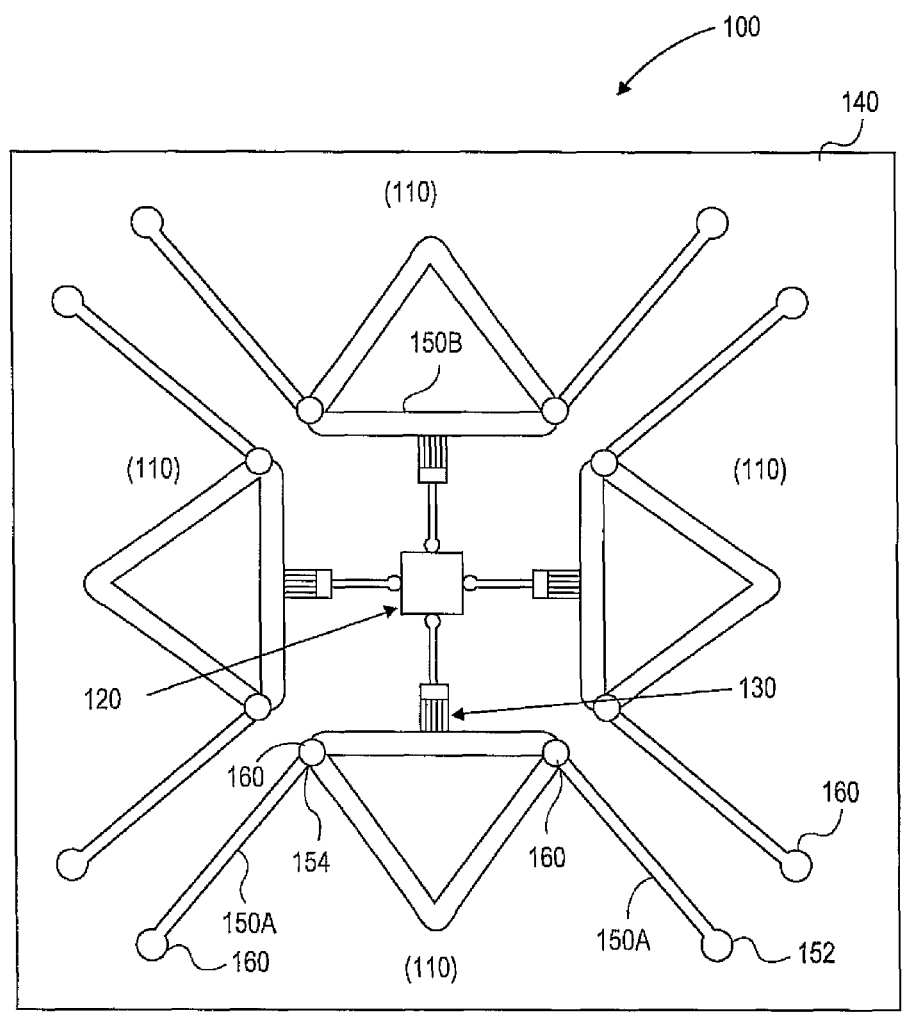
FIG. 1 illustrates an exemplary fixturing device in accordance with an embodiment of the present invention.

For simplicity and illustrative purposes, the principles of the present invention are described by referring mainly to exemplary embodiments thereof. However, one of ordinary skill in the art would readily recognize that the same principles are equally applicable to, and can be implemented in, all types of fixture elements (fixels) providing mechanically adjustable characteristics, and that any such variations do not depart from the true spirit and scope of the present invention. Moreover, in the following detailed description, references are made to the accompanying figures, which illustrate specific embodiments. Electrical, mechanical, logical and structural changes may be made to the embodiments without departing from the spirit and scope of the present invention. The following detailed description is, therefore, not to be taken in a limiting sense and the scope of the present invention is defined by the appended claims and their equivalents.

As used herein, the term "fixel" refers to a fixture element. The fixel element can be a module, which in turn can be incorporated into a larger system or device as will be described in the following. Multiple fixels can be used to manipulate and/or hold a workpiece. As used herein, the term "workpiece" refers to a biological or biomedical component, e.g. a cell or tissue, or an electrical or mechanical component upon which work is to be performed or tests to be conducted.

In the following, exemplary embodiments are described for handling and fixturing non-adhered workpieces. The first embodiment is directed to monolithic compliant four-bar mechanism type fixels. Two other fixturing embodiments are directed to cantilever beam type fixels. A fourth fixturing embodiment is directed to a fixed-fixed beam type of fixel. Each type of fixel can be mechanically or automatically adjusted to exhibit a particular value of stiffness, both in range and direction, via a minimal set of adjustments. To quantify the fixel functionality and its dynamic range, theoretical models are provided for each fixel configuration, for either determining or implementing a stiffness characteristic at the point of fixel-workpiece contact, expressed as a function of the mechanical variables of each fixel design. Upon establishing a common stiffness range for the different fixel designs, a metric can be formed based on the sensitivity of stiffness expressed as a function of slenderness ratio and an operation range, bounded by a maximum stiffness value shared by all fixture models. Using this metric, results are generated to delineate the advantages and disadvantages of each design and their potential impact on fixturing and material handling in the creation or manipulation of micron features on micro and macro workpieces.

It should be noted that the disclosed embodiments are specific to the fixel configurations and only illustrate their application within the active-dynamic fixturing system by using four fixel modules. However, it will be appreciated that more or less number of fixel modules can be used. Determination of the specific number and optimal locations of the fixel modules required is workpiece and process dependent.

By integrating the adjustability of each fixel module in a coordinated manner with other fixel modules and when combined with the workpiece, the active fixturing system takes the form of a parallel kinematic mechanism (PKM). Due to the geometric coupling within the PKM, the system can have directionally and configuration dependent nonlinear stiffness characteristics. Leveraging these similarities with the PKM, the active fixturing can also provide dual-capability fixturing as well as manipulating micro/mesoscale workpieces, ranging in size from several microns to several millimeters. Furthermore, via mechanical adjustments of the fixel modules, as will be described in the following, the fixturing device can tune the kinematics and dynamics of the mesoscale machine tool to passively or actively control the tool-workpiece interface dynamics. By determining a range of stiffness over ranges of the mechanical variables for each fixel module, one can extract from the stiffness relationship both localized and global possibilities. This stiffness relationship can then be applied towards development of efficient control algorithms implemented through actuated adjustments of the mechanical variables of the fixel modules. Although four fixel modules are typically depicted in the exemplary embodiments, it will be appreciated that any number of fixel modules can be used dependent upon the part or workpiece that is being fixtured (held) by the fixel module configuration. The number of fixel modules needed can be determined by generating form and force closure analyses. However, it can be generalized that four fixel modules can be used to arrest all degrees-of-freedom of the planar motion of a part being fixtured and/or manipulated.

FIG. 1 illustrates an exemplary active-dynamic fixturing system 100 in accordance with various embodiments. It should be readily apparent to those of ordinary skill in the art that the system depicted in FIG. 1 represents a generalized schematic illustration and that other components may be added or existing components may be removed or modified.

As shown in FIG. 1, the system 100 can include a plurality of fixturing elements (fixels) 110, a workpiece 120 and interface elements 130 positioned between each fixel 110 and the workpiece 120. The fixels 110 are also characterized herein as a fixel module, due in part to independently adjusting stiffness characteristics of each and their ease of incorporation into various structures and in varying numbers according to a workpiece and other factors. The fixel modules 110 operate in concert to hold and/or manipulate the workpiece 120. The interface elements 130 can include a force mechanism and/or embedded force transducer. The interface element 130 can facilitate the application (transmission) of the force directly between the fixel module 110 and the workpiece. The fixel modules 110 can be integrated with a tool, such as a micro or mesoscale machine tool 140. The machine tool 140 is only generally indicated, because the structure and function thereof can vary widely as known in the art. In the following exemplary embodiments, the workpiece 120 can be manipulated and positioned through direct contact with fixel modules 110 rather than being adhered to a positioner or other support as is found in the art.

Figure 2A:
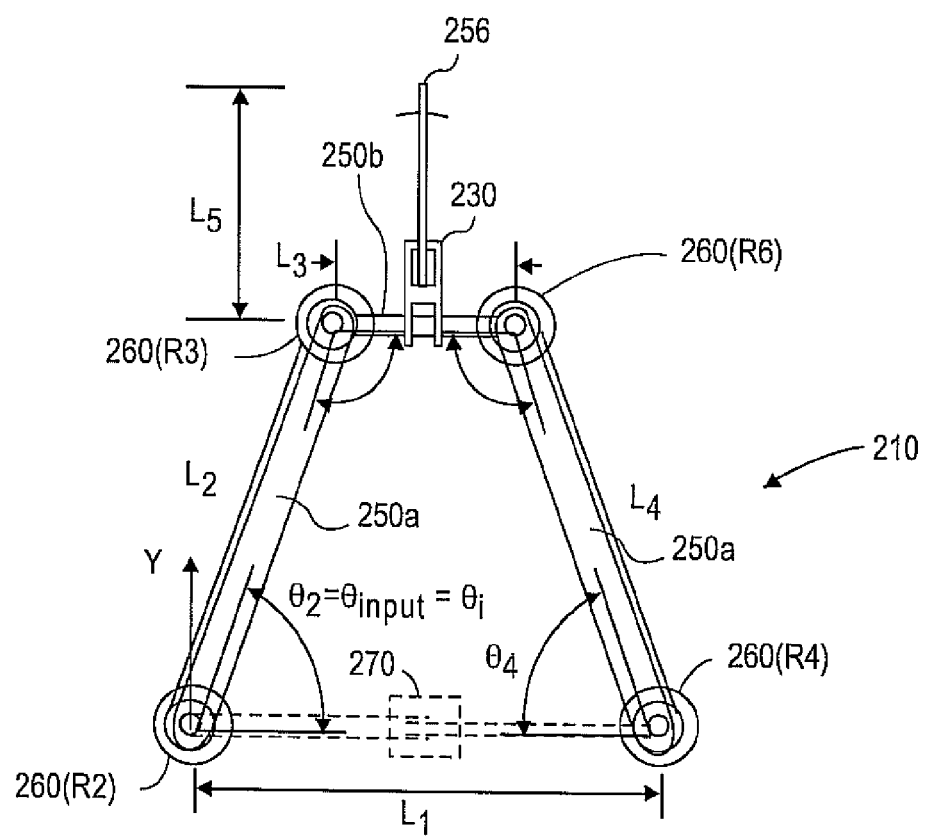
FIG. 2A illustrates an exemplary fixing element module, also denoted as a fixel, for use in the fixturing device of FIG. 1 in accordance with various embodiments.

Each fixel module 110 can include a monolithic compliant mechanism of links 150 and revolute joints/flexures 160 further described in connection with FIGS. 2A and 2B. In FIG. 1, a combination of four monolithic compliant mechanisms is depicted where each monolithic mechanism can include a four-bar structure. In FIG. 2A, the monolithic compliant mechanism can include a modified structure exhibiting the same characteristics as the four-bar structure of FIG. 1. In embodiments above and below, the links 150 can be rigid or flexible according to an end use and stiffness of the fixel module 110. Relative rigidity and/or flexibility of the links 150 are considered to be within the scope of the invention.

The revolute joints 160 can include traditional spring biased joints, compliant joints, or a combination thereof. In operation, and as will be described further below, an application of force to the module 110 can stress the fixel module 110 about any of the revolute joints 160. In the embodiment of FIG. 1, four revolute joints 160 are depicted.

In the exemplary embodiment of FIG. 1, four fixel modules 110 are depicted; however it will be appreciated that an active-dynamic fixture configuration can include more than or fewer than four fixel modules 110. Generally, each fixel module 110 can include a pair of base links 150a. Each base link 150a can include a base end 152 joined to the machine tool 140 and a second end 154 joined to a cross link 150b of the compliant module 110. A revolute joint 160 is positioned at the juncture of the second end 154 of each base link 150a and opposing ends of cross link 150b. In FIG. 1, the cross link 150b can be part of a triangular shaped link 150 as shown. It will be appreciated that certain modifications can be made to the cross link 150b without departing from the scope of the invention.

Referring yet to FIG. 1, the interface element 130 can be mounted substantially perpendicular to the cross link 150b as shown. One end of the interface element 130 can be fixed, braced, or otherwise attached to a center point of the cross link 150b. An opposing end of the interface element 130 can support, manipulate, or otherwise engage with the workpiece 120. It will be appreciated that an end of the interface element 130 engaged with the workpiece 120 can have a configuration consistent with the type of workpiece engaged and intended contact therewith.

Figure 2B:
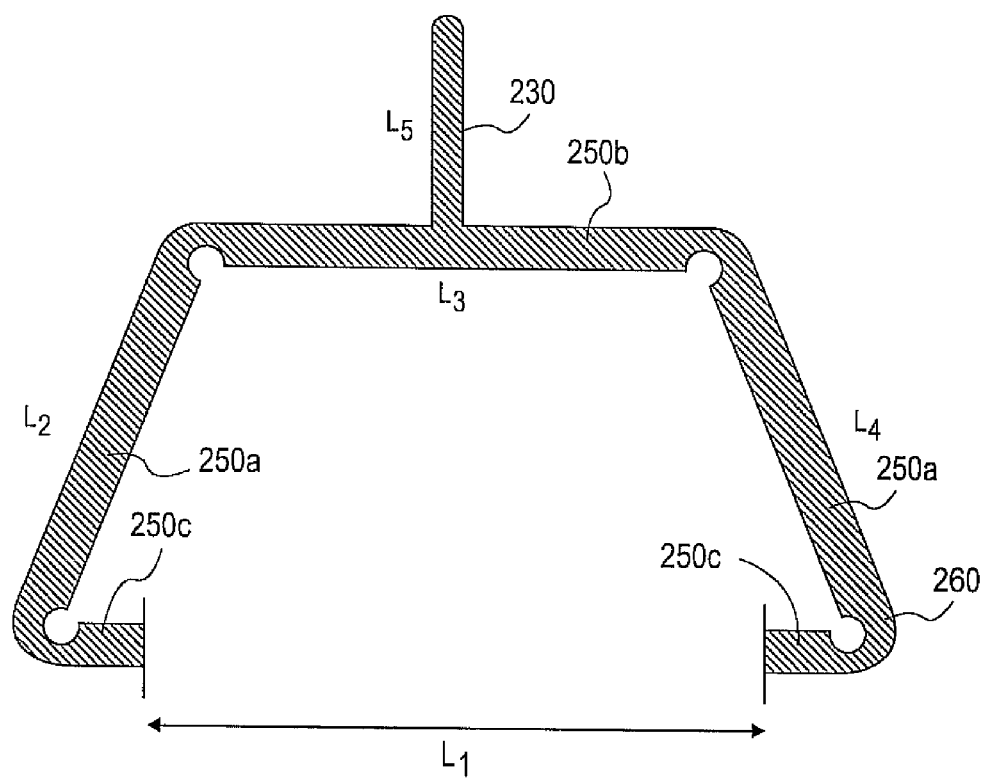
FIG. 2B shows a further exemplary fixing element module, also denoted as a fixel, for use in the fixturing device of FIG. 1 in accordance with various embodiments.

FIG. 2A illustrates an exemplary fixel module 210 and FIG. 2B illustrates an exemplary fixel module 210 characterized as a pseudo-rigid-body equivalent of the four-bar mechanism type monolithic fixel module in accordance with various embodiments. It should be readily apparent to those of ordinary skill in the art that the fixel module 210 depicted in FIG. 2B represents a generalized schematic illustration and that other components may be added or existing components may be removed or modified.

Referring to FIGS. 2A and 2B, with FIG. 2B depicting exemplary details of revolute joints 260, the fixel module 210 can be implemented with the fixturing system of FIG. 1, in place of fixel modules 110 therein.

In FIG. 2A, the fixel module 210 can include a pair of base links 250a. Each base link 250a can include a base end 252 joined to a machine tool (not shown, but as described in connection with FIG. 1) and a second end 254 joined to a cross link 250b of the compliant module 210. The links 250a, 250b can be of equal lengths or can be of different lengths according to a particular fixturing system requirement.

A revolute joint 260 is positioned at the juncture of the second end 254 of each base link 250a and opposing ends of cross link 250b. The revolute joints 260 can be of a spring loaded type, compliant type, or other suitable joint having a capacity to enable revolution under torsion of base links 250a and cross link 250b thereabout.

An interface element 230 can be mounted substantially perpendicular to the cross link 250b as shown. One end of the interface element 230 can be fixed, braced, or otherwise attached to a center point of the cross link 250b. An opposing end of the interface element 230 can support, manipulate, or otherwise engage with a workpiece (not shown but as described in connection with FIG. 1). The interface element 230 can include a force mechanism and/or embedded force transducer. The interface element 230 can therefore facilitate the application (transmission) of the force directly between the fixel module 210 and the workpiece.

An actuator 270 can be positioned substantially between the base ends 252 of each base link 250a. The actuator can include an adjustment device positioned to intersect a further link 250c joining the base ends 252 of the base links 250a. Further, the actuator can include a mechanism for selectively telescoping links 250c. Telescoping of the link 250c can be by mating screw threads, friction fit, or the like. In each instance, the actuator 270 is operable to adjust a distance between the base ends 252 of the base links 250a. The stiffness characteristics can be achieved by adjusting a distance between the base ends 252 and/or adjusting the angle $\theta_2$ or $\theta_4$, a change in angle achieved by rotating a link 250 about a corresponding revolute joint. It will be appreciated that one or both angles can be adjusted, and to different degrees according to stiffness parameters for a particular module. The actuator 270 can be operable before or during use of the module 210 alone or with a plurality of modules as depicted in FIG. 1.

Similarly, directional force on the cross link 250b can cause the links 250a of the module 210 to shift and rotate about one or more of the revolute joints 260.

Using the descriptive labels L1, L2, L3, L4, L5, the numbered revolute joints R2, R3, R4, R6, and interior angles $\theta_2$, $\theta_3$, $\theta_4$, and $\theta_6$ of either FIG. 2A or 2B, a Pseudo Rigid Body Model (PRBM) can be described herein in order to demonstrate the operational functionality of the fixel module 210 (and 110). PRBM is considered the most well known technique to design and analyze compliant systems that undergo large deflections. Using this concept, the deflection of flexible members can be modeled using equivalent rigid body components. The revolute joints can be modeled as kinematic pair type joints/pins with the stiffness of the revolute joints represented by torsional springs within the joints. For each PRBM, the most important consideration is the placement of the revolute/pin joints and the value of the spring constant to be assigned.

As shown in FIGS. 2A and 2B, and for purposes of modeling, as described below, joint flexures are modeled as revolute joints (R2, R3, R4 and R6) with torsional springs ($k_2$, $k_3$, $k_1$ and $k_6$, respectively), rigid links having equivalent constant link lengths of $L_2$, $L_3$, $L_4$, and $L_5$, and the contact point of the fixel with the workpiece occurring at the end of link $L_5$. For descriptive purposes, link $L_5$ is rigidly attached to $L_3$ (top horizontal link) at a 90 degree angle. The stiffness characteristic of each fixel module as seen at the point of fixel-workpiece contact can be mechanically adjusted by extending the base length ($L_1$) and/or an input angle ($\theta_2$).

For the pseudo rigid body model (PRBM), the link lengths were chosen such that $L_2=L_4$ and $L_3$ is shorter than the other links. With the assumption that all flexures (torsional springs) have equal stiffness, the compliant behavior of the mechanism exhibits static symmetry for a given $L_1$. It should be readily apparent to those of ordinary skill in the art that the above selection of link lengths and torsional spring stiffness represent a general illustration of the functionality of the active fixturing. Different selections will yield different ranges of manipulation and values of fixel module stiffness achievable for a given application of the fixel module 110, 210 depicted in FIGS. 1 and 2, respectively.

Figure 3A:
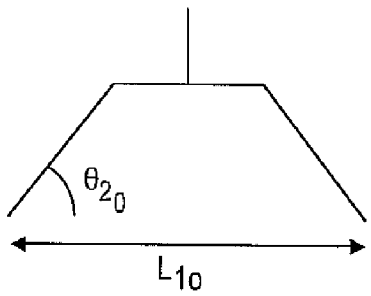
FIGS. 3A, 3B, 3C, 3D depict exemplary equilibrium configurations for a fixing element module, also denoted as a fixel, of the fixturing device in accordance with various embodiments.
Figure 3B:
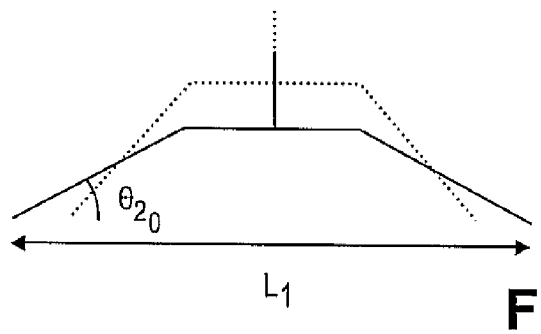
Figure 3C:
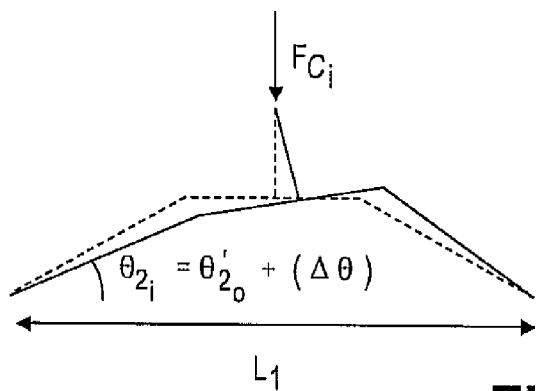
Figure 3D:
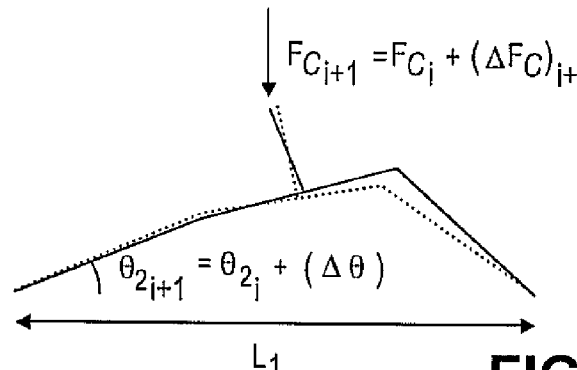

FIGS. 3A, 3B, 3C and 3D illustrate equilibrium configurations with varying contact forces. It should be readily apparent to those of ordinary skill in the art that the equilibrium configurations depicted in FIGS. 3A-3D represent generalized schematic illustrations. In keeping with the embodiments of FIGS. 1 and 2, the mechanism will return to the configurations of FIG. 3A or 3B, when contact force $F_C$ is zero (unloaded equilibrium configuration). Therefore without any loss of generality, the joint flexure's torsional loads are calculated using $\Delta\theta$ angles measured from these unloaded equilibrium configurations as depicted in FIGS. 3C and 3D. With these assumptions, a static force analysis results in the following equations, from which the fixel stiffness can be determined as a function of the two mechanical variables.

$$\begin{bmatrix} F_{C_x} \\ F_{C_y} \\ F_{32_x} \\ F_{32_y} \\ F_{34_x} \\ F_{34_y} \end{bmatrix} = \begin{bmatrix} 1 & 0 & 0 & 0 & 0 & 0 \\ 1 & 0 & 1 & 0 & 1 & 0 \\ 0 & 1 & 0 & 1 & 0 & 1 \\ 0 & 0 & M_{4,3} & M_{4,4} & 0 & 0 \\ M_{5,1} & M_{5,2} & M_{5,3} & M_{5,4} & M_{5,5} & M_{5,6} \\ 0 & 0 & 0 & 0 & M_{6,5} & M_{6,6} \end{bmatrix}^{-1} \begin{bmatrix} 0 \\ 0 \\ 0 \\ V_4 \\ V_5 \\ V_6 \end{bmatrix} \quad (1)$$

where $F_{ij}$ is the force acting on link i by link j, subscripts x and y indicate the corresponding (x, y) components of the forces $F_C$ and $F_{ij}$. In addition, $$V_4 = -[(k_2 * (\theta'_{2_0} - \theta_2)) + (k_3 * (\theta_3 - \theta'_{3_0}))] \quad (2)$$
$$V_5 = (k_3 * (\theta_3 - \theta'_{3_0})) + (k_6 * (\theta'_{6_0} - \theta_6))$$
$$V_6 = -[(k_6 * (\theta'_{6_0} - \theta_6)) + (k_4 * (\theta_4 - \theta'_{4_0}))]$$

$$M_{4,3} = L_2 * \sin(\theta_2) \quad M_{4,4} = -L_2 * \cos(\theta_2) \quad (3)$$
$$M_{5,1} = -L_5 * \cos(\theta_5) \quad M_{5,2} = -L_5 * \sin(\theta_5)$$
$$M_{5,3} = \frac{L_3}{2} * \sin(\theta_5) \quad M_{5,4} = -\frac{L_3}{2} * \cos(\theta_5)$$
$$M_{5,5} = -\frac{L_3}{2} * \sin(\theta_5) \quad M_{5,6} = \frac{L_3}{2} * \cos(\theta_5)$$
$$M_{6,5} = L_4 * \sin(\theta_4) \quad M_{6,6} = L_4 * \cos(\theta_4)$$

For each given $L_1$ (or $L_{10}$), the unloaded equilibrium configuration ($F_C=0$) is first determined, FIG. 3A or 3B. For each of these unloaded equilibrium configurations, the resulting four-bar mechanism's two toggle positions (motion limits) are determined. These provide the corresponding kinematic range of angles that comply with a design involving joint flexures. Next, the analysis continues through the given ranges of base length ($L_1$) and corresponding allowable kinematic ranges of input angle ($\theta_2$). Given the set of ($L_1$, $\theta_{2_0}'$, $\theta_{3_0}'$, $\theta_{4_0}'$ and $\theta_{6_0}'$) per FIG. 3B and as depicted in FIG. 3C or 3D, the vertical force ($F_{C_y}$) required to hold the mechanism in a static equilibrium is calculated as a function of $\theta_2$ using Equation (1). The stiffness at the point of fixel-workpiece contact is then approximated numerically as the change in contact force ($\Delta F_C$) divided by the change in displacement at the point of contact (FIGS. 3C and 3D). These calculations also denote the change in contact force required to create the change in the fixel workpiece contact point's location.

Figure 4A:
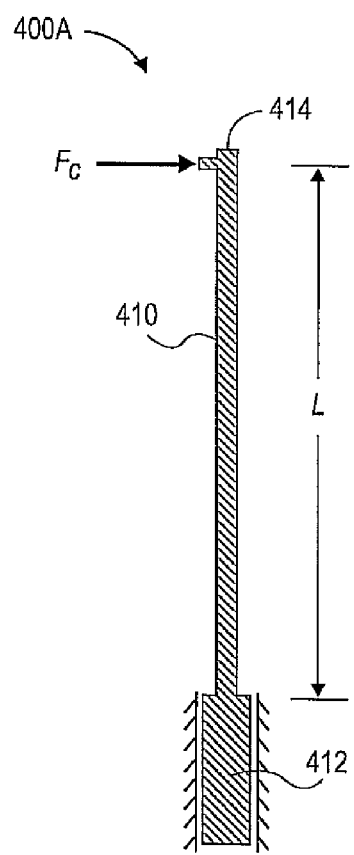
FIGS. 4A and 4B illustrate exemplary cantilever beam type fixing element modules in accordance with various embodiments of the present invention.
Figure 4B:
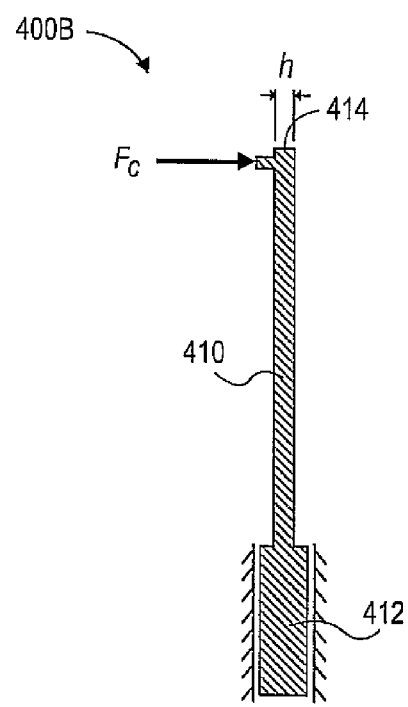

FIGS. 4A and 4B illustrate exemplary cantilever beam configurations 400A, 400B, respectively, in accordance with various embodiments. It should be readily apparent to those of ordinary skill in the art that the cantilever beam configurations 400A, 400B depicted in FIGS. 4A and 4B represent generalized schematic illustrations and that other components may be added or existing components may be removed or modified.

As shown in FIGS. 4A and 4B, the cantilever beam configuration can include a beam 410 fixed at a base end 412 to a support (not shown). A free end 414 of the beam 410 can contact a workpiece (not shown, but as explained in connection with FIG. 1). Each cantilever beam configuration 400A, 400B can be considered a fixel module.

For a cantilever beam configuration, the minimum value of k, or stiffness, occurs when the contact force is applied at the free end 414 of the beam 410. For a given material, this minimum k is a function of the length L of the beam 410 measured from the fixed end 414 and its moment of inertia I. In the following modeling and analysis, based on the configuration of FIGS. 4A and 4B, the beams 410 are assumed to have rectangular cross-sectional areas with breadth b and width h, however this generality used in modeling may not necessarily be the case for actual implementation. Therefore, in the following, mechanical adaptability for a cantilever beam type fixel will be achieved by either varying L or h, individually or together.

Referring first to FIG. 4A, a mechanical variable can be that of length "L" of the beam 410. Using cantilever beam equation for stiffness, the principles involved in the configuration of FIG. 4A can include adjusting the stiffness k at the point of fixel-workpiece contact (free end of the cantilever beam) by modifying the beam length L. Mathematically, the stiffness can be expressed as $$k = \frac{\alpha}{L^3} \quad (4)$$

where for FIG. 4A, $\alpha=3EI=Ebh^3/4$ and is a constant, and the mechanical variable is L.

Figure 5:
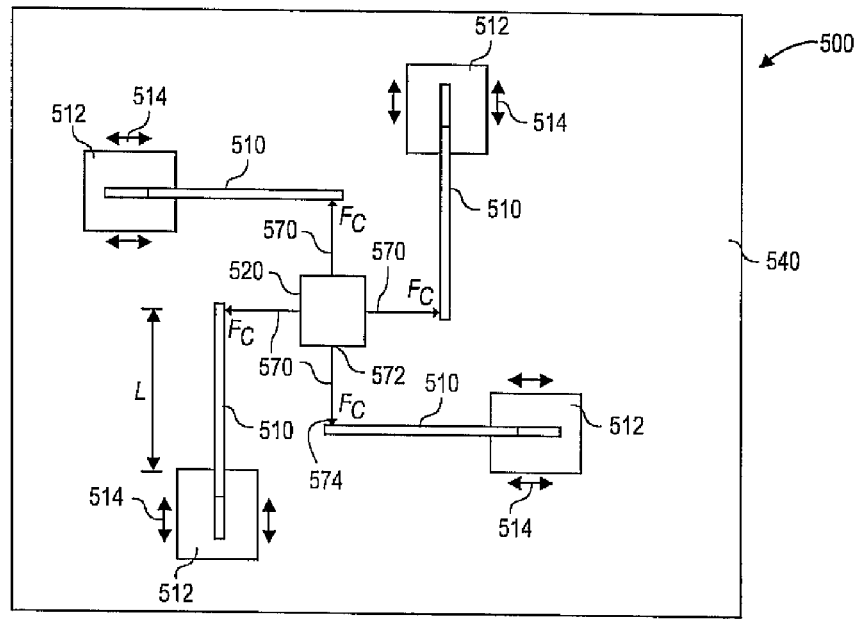
FIG. 5 illustrates a fixturing device in accordance with another embodiment of the present invention and based on the beam configuration of FIG. 4A.

The varying length compliant cantilevered beam configuration of FIG. 4A can be incorporated into an exemplary fixturing device 500 such as that illustrated in FIG. 5. It should be readily apparent to those of ordinary skill in the art that the fixturing device 500 depicted in FIG. 5 represents a generalized schematic illustration and that other components may be added or existing components may be removed or modified.

The fixturing device 500 of FIG. 5 can include varying length cantilever beam type fixel modules 510. To decouple residual motions from occurring when making changes in mechanical variables, contact by the fixel module 510 with the workpiece is acquired via interface components 570. Here, one end 572 of the interface component 570 has direct contact with the workpiece 520 and the other end 574 is connected to a point on or adjacent the free end of the cantilever beam type fixel module 510.

The beam 510 can be supported at a base end thereof by a fixture base module 512. The fixture base module 512 can be mounted on a support such as a micro or mesoscale machine tool 540 similar to that shown in FIG. 1.

The contact force $F_C$ between the workpiece 520 and the beam 510 acts along the interface element 570 and occurs at this point on the cantilever beam 510. This contact force required to hold the workpiece 520 will vary depending on the process loads involved (such as the machining force) and can be adjusted by means at the fixed end of the cantilever beam and/or modifying the stiffness of the cantilever beam. For example, the fixture base module 512 can slide or otherwise reciprocate in a substantially linear direction perpendicular to that indicated by arrows 514 to increase or decrease a contact force. To modify the effective stiffness at the point of contact, the fixture base module 512 can slide or otherwise reciprocate in a substantially linear direction as indicated by arrows 514 to increase or decrease the stiffness of the fixel.

In response to fixturing configurations, the base end 512 of the fixture module can also be used to change a length of the cantilever beam 510. For example, the cantilever beam 510 can include telescoping components or the like to lengthen or retract the beam. Upon telescoping or otherwise adjusting the beam length, a position of the fixture base module 512 can be adjusted to accommodate the length of the beam, in a direction as depicted by arrows 514. Even further, by moving a base end 512 of the fixture module, an effective beam length L (distance between the fixed end and the point of action of contact force) can be changed. It will be appreciated that the module bases 512 can be mounted to a support structure, such as a micro or mesoscale machine tool, similar to that shown in FIG. 1. In this configuration, the value of k given by Equation (4) can be adjusted during fixturing and set up as well as during the process.

For the fixel of FIG. 4A, the minimum value of k can occur when the length is $L_{max}$ and maximum value of k corresponds to $L_{min}$. In other words, $$k_{min} = \frac{\alpha}{L_{max}^3} \quad (5)$$

$$k_{max} = \frac{\alpha}{L_{min}^3} \quad (6)$$

For the purpose of comparisons between fixel designs, r can be defined to be the ratio of minimum to maximum values of the fixel mechanical variable. This ratio provides a dimensionless measure for quantifying the mechanical variable's range of motion, facilitating the comparison of the different fixel design types. For the configuration of FIG. 4A, r is the ratio of $L_{min}$ to $L_{max}$ and substituting r into Equation (5) results in the following equation.

$$k_{max} = \frac{\alpha r}{L_{min}^3} \quad (7)$$

Equation (7) provides a relationship between the design constants (material and geometric parameters), $k_{min}$, and the range of motion of the mechanical variables (r). Here, $L_{min}$ and r are the two unique parameters of FIG. 4A. The selection of $L_{min}$ and r determine the value of $L_{max}$. By varying $L_{min}$ from to this newly calculated $L_{max}$, a set of values of k are achievable for each given fixel configuration. For investigating the mechanical adaptability of the fixel, the design variations of FIG. 4A can be explored for different sets of the design parameter r for a given $L_{min}$ and $k_{min}$.

Referring now to FIG. 4B, a mechanical variable can be that of width "ft" of the beam 410. The fixel for the configuration of FIG. 4B is similar to that of FIG. 4A except that the length of the cantilever beam is held constant and the width h is varied. This can be physically achieved by adding multiple strips of a same length and breadth to the cantilever beam thus changing the effective width h'. The effective width can be calculated using the following relationship.

$$h' = h + n(\Delta h) \quad (8)$$

where n is the number of thin strips and $\Delta h$ is the width of each thin strip. Because $\Delta h$ has to be increased discretely (unlike L in FIG. 4A), a very small value of $\Delta h$ can be chosen such that the change in k is equal to the least count of the system.

Figure 6:
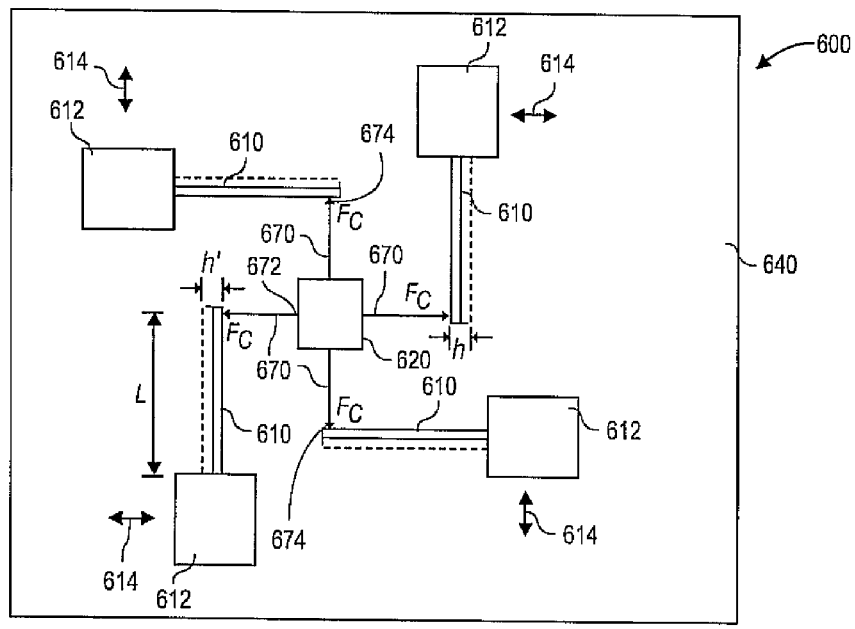
FIG. 6 illustrates a fixturing device in accordance with another embodiment of the present invention and based on the beam configuration of FIG. 4B.

The varying width compliant cantilevered beam configuration of FIG. 4B can be incorporated into an exemplary fixturing device such as that illustrated in FIG. 6. It should be readily apparent to those of ordinary skill in the art that the fixturing device 600 depicted in FIG. 6 represents a generalized schematic illustration and that other components may be added or existing components may be removed or modified.

As shown in FIG. 6, four fixel modules 610 can be used to hold the workpiece. The fixturing device 600 of FIG. 6 can include varying width cantilever beam type fixel modules 610. To decouple residual motions from occurring when making changes in mechanical variables, contact of the cantilever beam 610 with the workpiece is acquired via interface components 670. Here, one end 672 of the interface component 670 has direct contact with the workpiece 620 and the other end 674 is connected to a point on the cantilever beam 610 (near the free end).

The cantilever beam 610 can be supported at a base end thereof by a fixture base module 612. The fixture base module 612 can be mounted on a support such as a micro or mesoscale machine tool 640 similar to that shown in FIG. 1.

The contact force $F_C$ between the workpiece 620 and the cantilever beam 610 acts along the interface element 670 and occurs at this point on the cantilever beam 610. This contact force required to hold the workpiece can vary depending on the process loads involved (such as the machining force) and can be adjusted by means at the fixed end of the cantilever beam and/or by modifying the stiffness of the cantilever beam. For example, the fixture base module 612 can slide or otherwise reciprocate in a substantially linear direction as indicated by arrows 614 to increase or decrease an applied force, either from or against the workpiece 620 and/or modifying the stiffness by changing the value of h'.

The value of h' (and thereby the number of thin strips) needed to obtain a required k can be calculated using Equation (8). The width can be changed from a minimum value of $h_{min}$ to a maximum value of $h_{max}$ which would correspond to a minimum and maximum value for fixel stiffness k given by the following equations:

$$k_{min} = \frac{Ebh_{min}^3}{4L^3} = \beta h_{min}^3 \quad (9)$$

$$k_{max} = \frac{Ebh_{max}^3}{4L^3} = \beta h_{max}^3 \quad (10)$$

where for the fixel of FIG. 4B, $\beta$ can be a constant defined as $\beta = Eb/4L^3$ and the mechanical variable is h. Similar to FIG. 4A, introducing r as the ratio of $h_{min}$ to $h_{max}$ and substituting r into Equation (9), results in the following equation:

$$k_{min} = \beta r^3 h_{max}^3 \quad (11)$$

Here, $h_{max}$ and r are the two unique parameters of FIG. 4B and fixed values for these parameters determine the value of $h_{min}$. By varying h from $h_{max}$ to this newly calculated $h_{min}$, a set of values for k are achievable for each given design. Similar to that of FIG. 4A, variations of the configuration in FIG. 4B can be utilized to obtain different sets of the design parameter r for a given $h_{max}$ and $k_{min}$. These results can be compared with the designs of other Pixels to further delineate their effectiveness.

Figure 7:
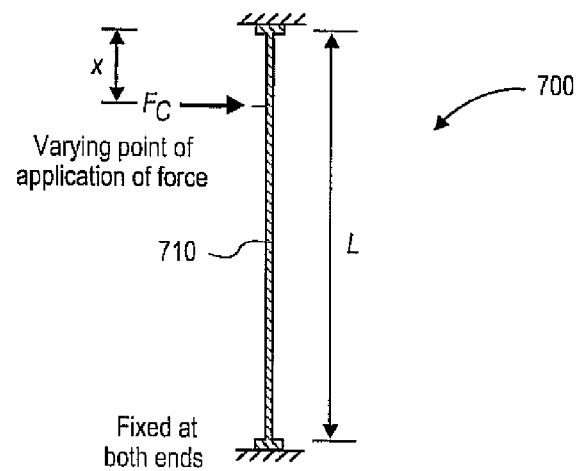
FIG. 7 illustrates an exemplary fixed beam type fixing element module, also denoted as a fixel, in accordance with various embodiments.

FIG. 7 illustrates an exemplary fixed-fixed beam fixel module configuration 700 in accordance with various embodiments. It should be readily apparent to those of ordinary skill in the art that the fixed beam fixel module 700 of FIG. 7 represents a generalized schematic illustration and that other components may be added or existing components may be removed or modified.

As shown in FIG. 7, the fixel for this embodiment includes a beam 710 fixed at both ends. An application of force against the fixed beam 710 results in a different resistance along the beam according to a distance from the fixed ends. A workpiece (not shown) can be held via contact with one end of an interface element (similar to that of FIG. 4A) where the interface element connects at some point along the beam. The connection of the interface element can be at a mid-point of the beam and can be at any other suitable point on the beam between the mid-point or the fixed end of the beam.

Figure 8:
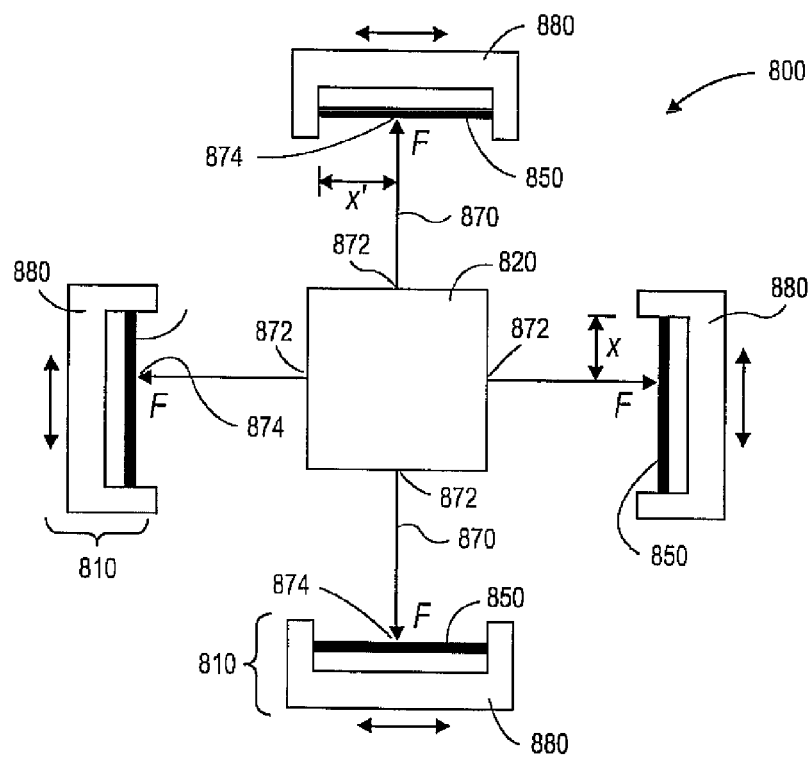
FIG. 8 illustrates a fixturing device in accordance with another embodiment of the present invention and based on the beam configuration of FIG. 7.

The fixed beam embodiment of FIG. 7 can be incorporated into an exemplary fixturing device 800 such as that illustrated in FIG. 8. It should be readily apparent to those of ordinary skill in the art that the fixturing device 800 depicted in FIG. 8 represents a generalized schematic illustration and that other components may be added or existing components may be removed or modified.

As shown in FIG. 8, four fixel modules 810 can be used to hold workpiece 820. Each fixel module 810 can include a beam support member 880 against which opposing ends of the fixed beam 850 is mounted. The beam support member 880 can slide in a direction parallel to a longitudinal axis of the fixed beam 850 as depicted by arrows therein. An interface element 870 has a first end supporting and/or manipulating a workpiece 820 and a second end slidably engaged with the fixed beam 850. The second end of the interface element 870 defines a contact point 874 at a point of engagement with the fixed beam 850. Each contact point can be at a distance x from a fixed end of the beam 850 and the contact force $F_C$ acting along the interface element can be exerted on the beam 850 at this point. By simultaneously moving the beams 810 along the direction of its longitudinal axis and by allowing the end of an interface element 870 to roll (or slide freely) on the beam 850, the contact force point of application can be changed without inducing any motion of the workpiece 820. The new value of x obtained by this change corresponds to the value of k required at this instance. This value of x can be calculated using the relationship between k and x given by $$k = \frac{\gamma L^3}{x^3(L-x)^3} \quad (12)$$

where L is a fixed length and γ is a constant defined as γ=3EI=Ebh³/4.

Any motion of the workpiece 820 and/or beam support member 880 along the direction of the contact force will change the magnitude of the contact force for given stiffness defined by the distance x. Thus, in this configuration, stiffness k can be controlled by varying the point of application of the contact force ($F_C$), i.e., by adjusting the mechanical variable x. The distance of the contact point can be varied from a minimum value of $x_{min}$ to a maximum value of $x_{max}$ where $x_{max}$ will be half the fixed length L of the beam (due to the symmetry of the fixel system). The corresponding minimum and maximum values of k are given by $$k_{min} = \frac{2Ebh^3}{x_{max}^3} \quad (13)$$

$$k_{max} = \frac{Ebh^3 L^3}{4x_{min}^3(L-x_{min})^3} \quad (14)$$

Introducing r as the ratio of $x_{min}$ to $x_{max}$ and substituting r into Equation (14) results in the following equation $$k_{max} = \frac{2Ebh^3}{r^3(2-r)^3 x_{max}^3} \quad (15)$$

Here, $x_{max}$ and r are the two unique parameters of FIG. 7. Also, similar to the previous configurations, fixed $x_{max}$ and r values can be used determine a unique value of $x_{min}$. Again, similar to the previous designs, for a fixed $x_{max}$ and for different sets of the design parameter r, variations of the configuration of FIG. 7 can be obtained. Each variation results in a set of k values that can be achieved from varying its mechanical variable (x) from $x_{min}$ to $x_{max}$.

There are results and comparisons which can be made for the above exemplary embodiments. These relationships are depicted in the graphs of FIGS. 9 through 17 as follows.

Figure 9:
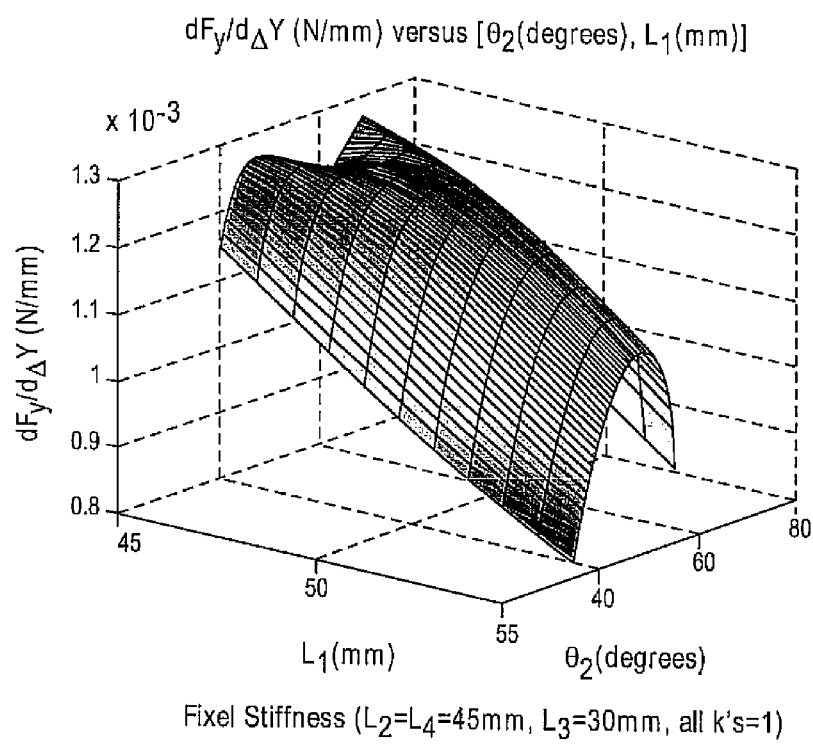
FIG. 9 graphically illustrates fixel stiffness at a fixel-workpiece contact point for the four-bar type fixel of FIG. 1, plotted as a function of two mechanical variables ($L_1$, $\theta_2$)

In FIG. 9, the fixel stiffness as seen at the point of fixel-workpiece contact for the four-bar type fixel is plotted as a function of the two mechanical variables ($L_1, \theta_2$). These results were generated for the fixel design with constant parameters $L_2=L_4=45$ mm, $L_3=30$ mm and all k's equal to one; chosen to exhibit the same relative footprint as the configurations of FIGS. 4A, 4B, and 7. Due to the design constraints of $L_2=L_4$ and joint flexures of equal stiffness, dynamic symmetry is observed for mechanical variable $\theta_2$ for each $L_1$. Because of the dynamic symmetry, this trend in stiffness of the fixel is independent of the numerical value of the joint stiffness and the link lengths. However, the relative magnitude of the link parameters and stiffness values can impact the amplification of the instantaneous stiffness values and thus the dynamic range achievable for a given range of the mechanical variables. This is apparent in FIG. 9 by observing the different contours in $\theta_2$ for different $L_1$. For example, an $L_1=45$ mm fixel configuration exhibits a local minimum about its unloaded equilibrium configuration ($\theta_2 \approx 50$ deg) and therefore is resistant to changes from this configuration. While for $L_1=53$ mm fixel at its unloaded equilibrium configuration, the fixel exhibits a peak stiffness value $\theta_2$ where deviations from this configuration take less effort due to a fixel stiffness behavior of soft spring. It can also be observed that the range of k decreases as the range of $\theta_2$ decreases. The presence of these variations in the trends can provide for greater control diversity in tuning the fixture dynamics via actuating the base length ($L_1$) and input angle ($\theta_2$) either individually or together.

Arbitrarily considering values for each fixers fixed and unique design parameters, would not yield a discernable comparison of the different types of fixel designs. Thus, to compare the configurations of FIGS. 4A, 4B and 7, this minimum value of k for each of the configurations with a same specified value of r were made equal. That is, $$k_{min} = \left.\frac{Ebh^3 r^3}{4L_{min}^3}\right|_{design\ 2a} \quad (16)$$

$$= \left.\frac{Ebr^3 h_{max}^3}{4L^3}\right|_{design\ 2b}$$

$$= \left.\frac{2\ Ebh^3}{x_{max}^3}\right|_{design\ 3}$$

$$\frac{k_{min}}{Eb} = \frac{h^3 r^3}{4L_{min}^3} = \frac{r^3 h_{max}^3}{4L^3} = \frac{2h^3}{x_{max}^3} \quad (17)$$

$$r = \frac{L_{min}}{L_{max}} = \frac{h_{min}}{h_{max}} = \frac{x_{min}}{x_{max}} \quad (18)$$

By restricting that all configurations of FIGS. 4A, 4B and 7 have the same minimal fixel stiffness ($k_{min}$), the value of $k_{min}$ at r equals 1 is also found to be the same for all three configurations. Note, when r equals 1, the range of motion of the mechanical variable is zero, thus the fixel has lost its adaptive feature. With this common window of constraints on the stiffness values formed by the $k_{min}$ restriction, the values of $k_{max}$, $\Delta k$ (equal to $k_{max}-k_{min}$) and the average slope of k ($\Delta k$ by change in the varying parameter of the design) for the intermediate values of r, the different beam type fixel designs can be compared more directly.

For Equation (16) to yield a viable comparison, it was assumed that the breadths (b) of the beams of each configuration are equal and that the material of the beam is also the same. Furthermore, the constant beam width h of FIG. 4A was made to be equal to $h_{min}$ for FIG. 4B, and the constant beam width h of FIG. 7 was made equal to r times of $h_{min}$ of FIG. 4B (where r would be a constant for a particular variation of the three designs). Similarly, the constant length L of FIG. 4B was made equal to $L_{min}$ of FIG. 4A and $x_{max}$ of FIG. 7 was made to be twice $L_{min}$. This can lead to the different beam type fixel designs having the same lower bound on the slenderness ratio.

The slenderness ratio (s) of a beam can be defined as the ratio of the minimum length of the beam to its maximum width. For the different beam type fixel designs, the following relationships can be used to define the lower bound on s.

$$s = \frac{L_{min}}{h_{max}} \text{ for FIGS. 4A and 4B} \quad (19)$$

$$s = \frac{2x_{max}}{h_{max}} \text{ for FIG. 7} \quad (20)$$

where, from the assumptions of Euler-Bernoulli beam theory, s should be greater than 10.

To determine $L_{min}$, the size of the workpiece has to be considered. Assuming that the workpiece has a size of 10 mm×10 mm×10 mm, for example $L_{min}$ would be $$L_{min}=10\ mm \quad (21)$$

From specified values of $L_{min}$, r and s, the parameters of comparative fixel designs and the corresponding k values can be obtained by the following procedure:

Configuration of FIG. 4A

1. Equation (21) gives the value of $L_{min}$
2. Using the specified value of s, the value of $h_{max}$ can be obtained from equation (19). Then using equation (18) and the specified value for r, $h_{min}$ can be calculated to determine the constant beam width h.

$$h=h_{min} \quad (22)$$

3. Using equation (18) with the same value of r, the value of $L_{max}$ can be obtained from the known value of $L_{min}$.

4. For each fixel design variation defined by specified values of s and r, a range of values for L varying from $L_{min}$ to $L_{max}$ can be obtained which correspond to a range of values of k.

Configuration of FIG. 4B

1. Equation (21) gives the value of $L_{min}$ which would be equal to the constant beam length L of the design.

$$L=L_{min} \quad (23)$$

2. Values of $h_{max}$ and $h_{min}$ for specified values of s and r are the same as that obtained above for Configuration of FIG. 4A.

3. A range of values for h varying from $h_{max}$ to $h_{min}$ can be obtained which correspond to a range of values of k.

Configuration of FIG. 7

1. As previously explained, $x_{max}$ is twice the value of the $L_{min}$ obtained from equation (21).

$$x_{max}=2L_{min} \quad (24)$$

2. Also, the constant width of the beam would be r times $h_{min}$. Using the known value of $h_{min}$ from the above configuration of FIG. 4A calculations, the fixed width can thus be calculated.

$$h=rh_{min} \quad (25)$$

3. The value of $x_{min}$ for specified values for r can then be determined by substituting the value of $x_{max}$ into equation (18).

4. For specified values of s and r, a range of values of x varying from $x_{max}$ to $x_{min}$ can be obtained which correspond to a range of values of k.

For each of the above beam type fixel designs, $k_{min}$, $k_{max}$, $\Delta k$ and average slope of k were plotted as a function of r and s (r varies from 0.1 to 1 and s varies from 10 to 30).

Figure 10:
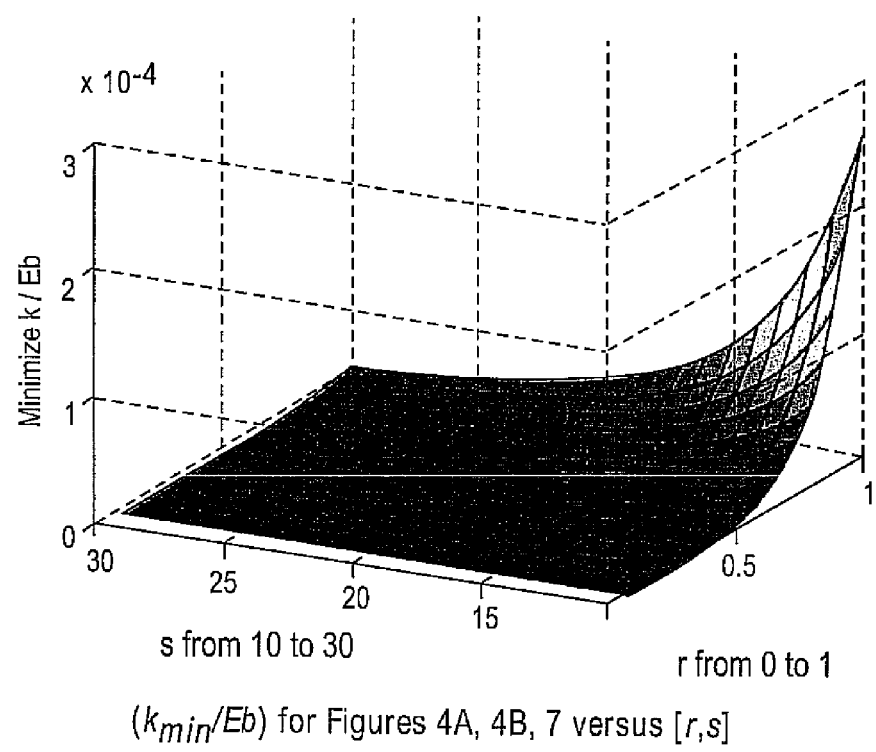
FIGS. 10 through 17 are normalized plots of the stiffness quantities ($k_{min}$, $K_{max}$, $\Delta k$ and average slope of k) normalized with respect to (Eb) with FIG. 11 corresponding only to the embodiments of FIGS. 4A and 4B. These are plotted as a function of the ratio of the minimum to maximum values of the fixel mechanical variable of adjustment (r) and the slenderness ratio (s) defined as the ratio of the minimum length of the beam to its maximum breadth (b). The (E) denotes the material property known as the Young's Modulus.

FIGS. 10 through 17 are normalized plots of the stiffness quantities ($k_{min}$, $k_{max}$, $\Delta k$ and average slope of k) with respect to (Eb). These results provide the trends for each design independent of the fixel material properties. FIG. 10 demonstrates that all of the three designs have the same instantaneous $k_{min}$ values, shown as a function of r and s.

Figure 11:
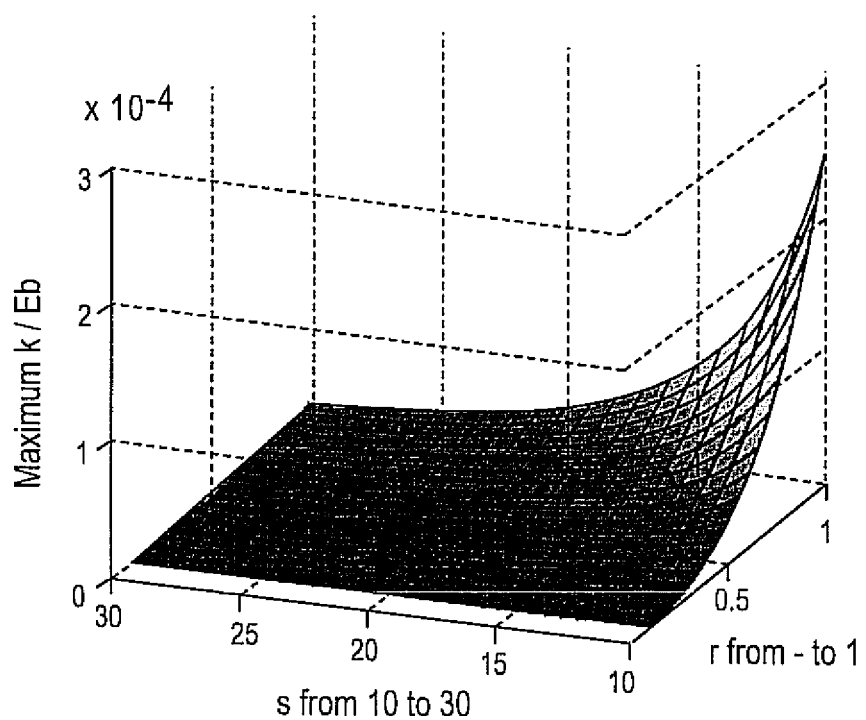
Figure 12:
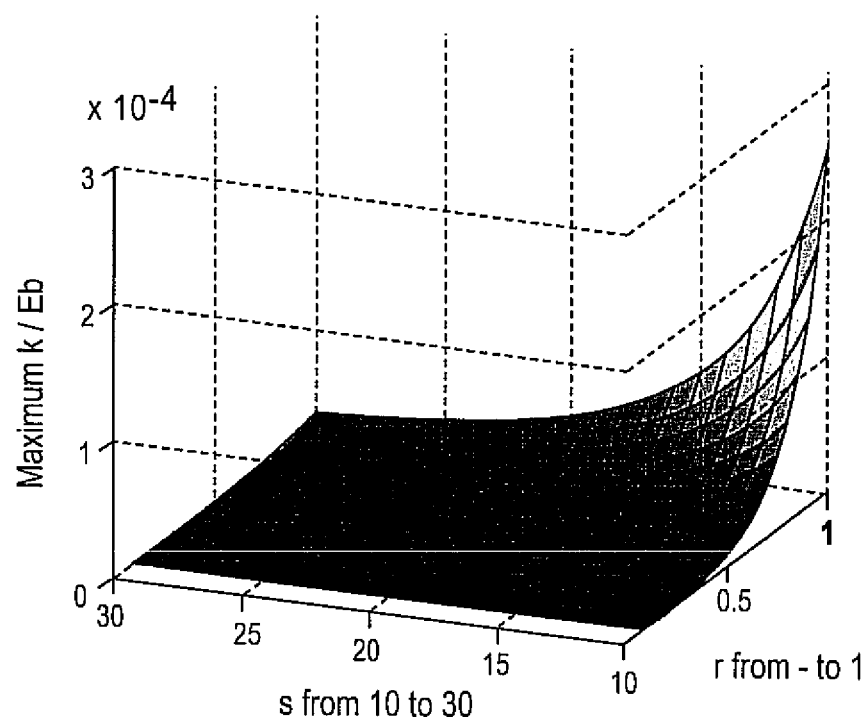

FIGS. 11 and 12 demonstrate the variation of $k_{min}$ for various combinations of [r, s]. It is found that all the designs have the same maximum possible $k_{max}$ value (which occurs at r=1 and s=10). However, the variation of $k_{max}$ as a function of r and s is different for configuration of FIG. 7.

Figure 13:
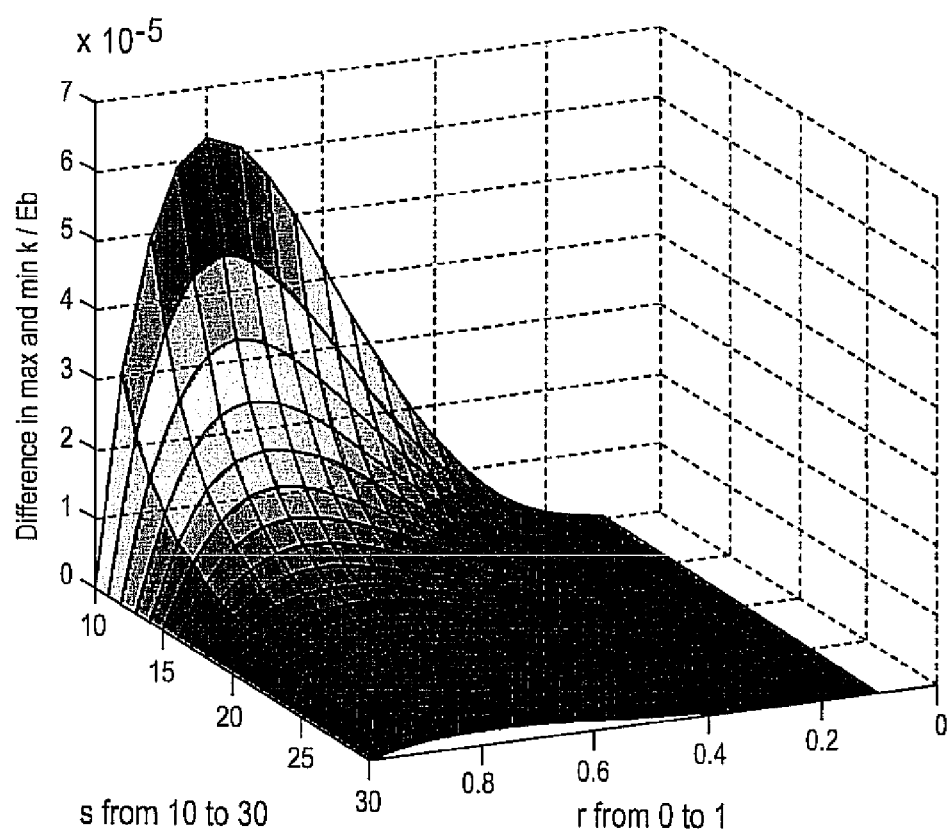
Figure 14:
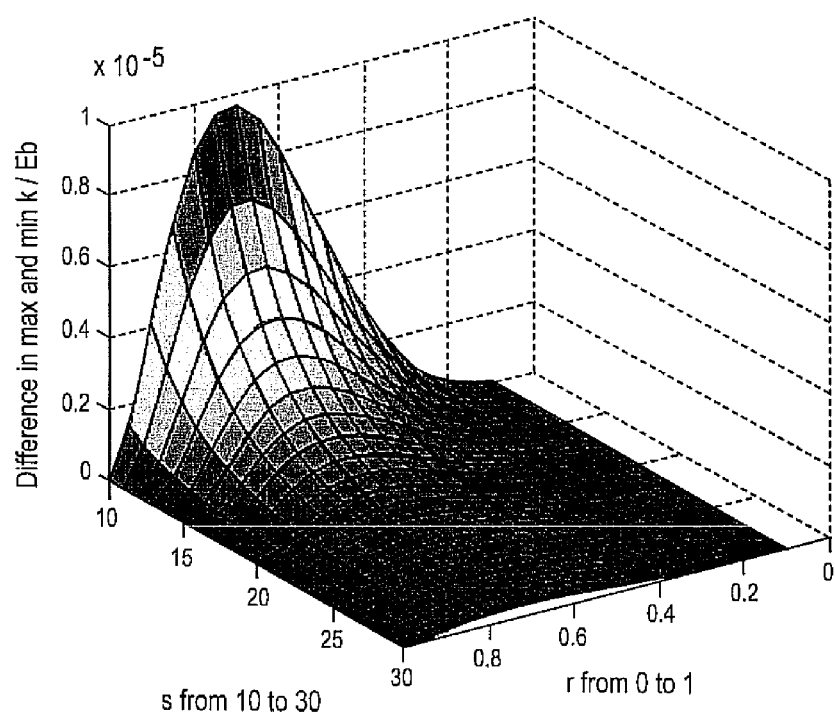

FIGS. 13 and 14 represent the variations of $\Delta k$ (difference between $k_{max}$ and $k_{min}$) for the three beam type designs.

Figure 15:
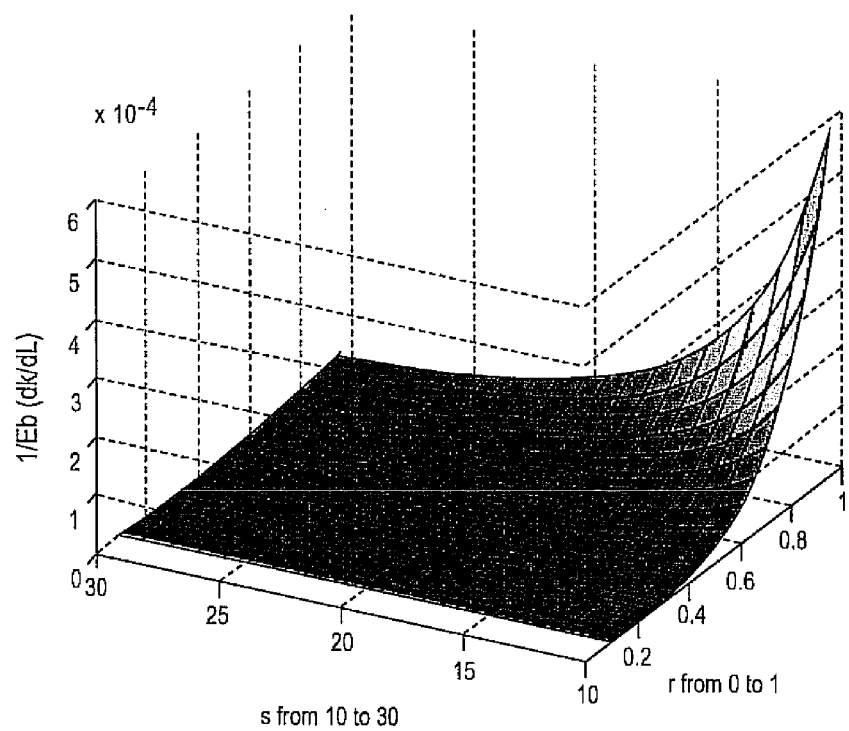
Figure 16:
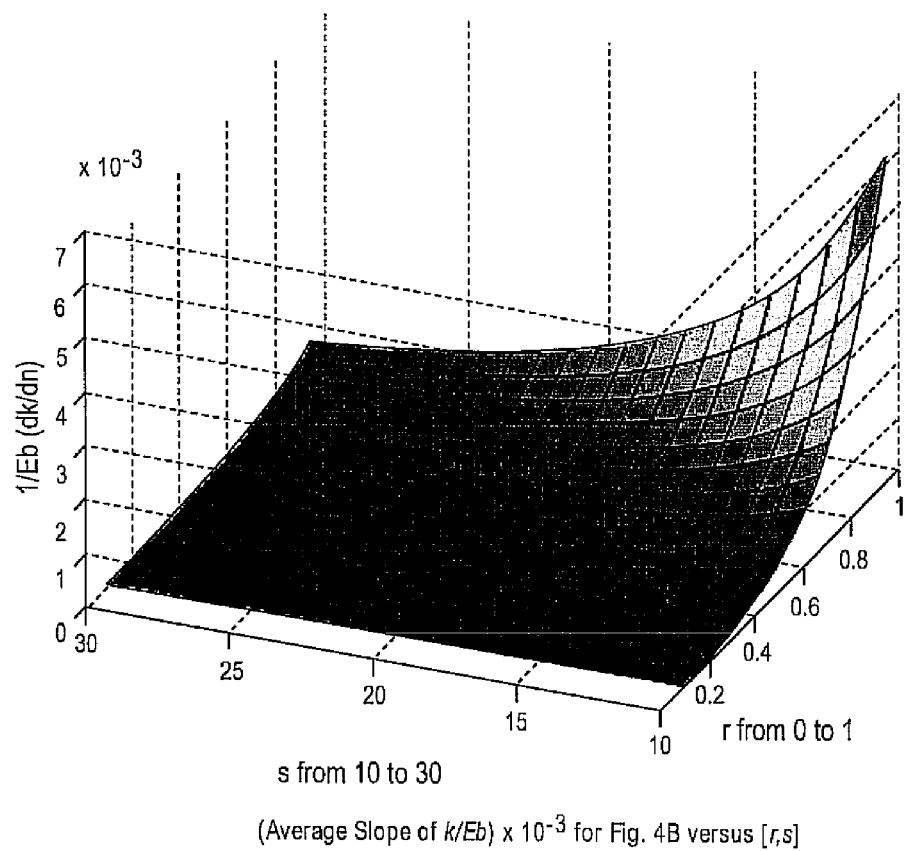
Figure 17:
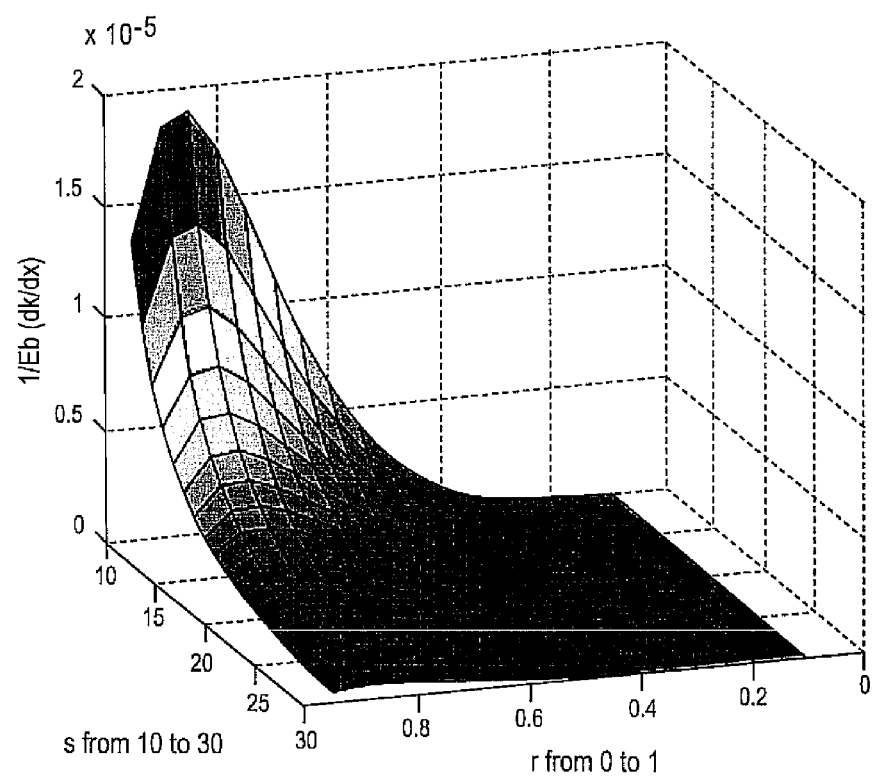

FIGS. 15 through 17 are the plots for the average slopes of k.

From the above plots, it can be observed that the range of k's achievable reaches a maximum at around r≅0.8 for all slenderness ratios. Also, a smaller s (shorter or thicker beams) yields a greater range in k. For the configuration of FIG. 4B, this can be attributed to the smaller the slenderness ratio s, the larger $h_{max}$ for given $L_{min}$ which in turn has the effect of increasing the range of the mechanical variable h. This increase in $h_{max}$ effects the h of FIG. 4A which in turn has a similar amplification affect on this design's resulting range of k. The $\Delta k$ were also found to be higher for FIGS. 4A and 4B than that of FIG. 7 (by a factor of 7). For an overall measure of k variations between $k_{min}$ and $k_{max}$, FIG. 4B trends were found to be a factor of 10 higher in average change in k, as compared to FIG. 4A and FIG. 7. This indicates that FIG. 4B has greater mechanical adaptability for a given variable range (defined by r).

The fixel configurations presented herein utilize mechanically adaptable stiffness characteristics in active fixturing, and the dynamic response of the workpiece during manufacturing of micron features can be improved. As used herein, the term "mechanically adaptable" is intended to refer to the selectively variable parameters, including stiffness and force, as they are adjustable by at least length, width, breadth, orientation, and in plurality module stiffness and points of application of force and position of the disclosed fixel modules.

It will be appreciated that the four-bar mechanism type fixel of FIGS. 1 and 2 can offer greater versatility in that two mechanical variables can be used for making adjustments. This adds to the complexity of the design by requiring twice as many actuators for actively controlling these variables. However, the results indicate that by actively controlling only the base length, the fixel can still be tuned to control its dynamic behavior. In addition, trends observed in the stiffness as a function of the mechanical variables exhibit local minimums, attributes that can further lend to the dual active-passive controller mode of implementation.

For beam type fixels, configurations of FIG. 4A and FIG. 7 exhibit continuous adaptability fixel stiffness while the configuration of FIG. 4B exhibits incremental adjustments in changing its stiffness. For these three configurations, it was found that similar trends occurred in terms of k versus available range of input variable. Additionally, the lower bound on the slenderness ratio contributes to an amplification of the rate of change in k with respect to change in input variable, as well as on the range of k. The configuration of FIG. 4B can yield the greatest of all values for both range of k and average slope of k.

There are various analyses which can be performed by incorporating one of the exemplary embodiments into a machine tool setup. The performance of one of the embodiments under operation conditions subject to runout induced errors is analyzed.

The fixel embodiment and the number of compliant fixels (of that embodiment) used in a setup will depend on the type of manufacturing process. For example, in case of a meso scale drilling process at least four fixels of four bar mechanism type are required. The (X, Y) directional stiffness characteristics of fixels of four bar mechanism type integrated in a coordinated manner is best suited for achieving the preferred fixturing capabilities and accurate drilling. In the case of a milling process, two fixels of any of the four embodiments are theoretically required to achieve fixturing capabilities. Because each of the embodiments have the same principle of utilizing adjustable stiffness characteristics, the analysis is done, without loss of generality, for only one of the embodiments for only a particular meso manufacturing process. The results of this analysis can be extended to other embodiments and processes. The fixel of FIG. 4A is selected for analysis and is implemented in an end milling machine tool system which has runout in the direction perpendicular to feed. Another example of such a system could be a burnishing setup where a mesoscale workpiece with micro features is being burnished for improved finishing. When the tool is burnishing the surface of the workpiece which is close to the feature, the runout in the tool (perpendicular to the feed) inadvertently affects the dimensions of feature during the burnishing process.

One more mesoscale manufacturing setup which can have runout in the perpendicular direction to the feed is a peripheral milling setup with runout error occurring due to variation in teeth lengths. Considering that in such a setup, one of the teeth of the cutter is longer than the other teeth, the excess length of the longer teeth corresponds to the runout error. Such runout errors in a peripheral milling setup results in varying depth of cut and this error can be compensated by following the same procedure as that for the end milling setup which is explained herein.

Static Analysis of Fixel of FIG. 4A

The fixture workpiece setup for an end milling operation with two fixels of FIG. 4A. The fixture-workpiece is fixed to the platform of the milling machine such that the rigid fixels are aligned parallel to the direction of motion of the platform. These rigid links counter the cutting force during the milling operation. Assuming for the current setup, that the tool on the milling machine has radial runout in the direction perpendicular to the cutting direction, the compliant fixels are aligned in this direction. Due to this runout, the thickness of the slot being machined into the workpiece is larger than the required value. The perpendicular runout of the tool in such a system results in a force (extraneous to cutting force) acting on the workpiece which then acts along the interface element of the compliant fixel. Since the interface element is connected to the variable length compliant beam at its free end, it leads to the bending of the beam which then results in a corresponding displacement of the workpiece. The rigid fixels slide freely in this direction without their contact with the workpiece slipping so that it does not introduce any resistance to the compliant fixture's corrective displacement of the workpiece.

The objective is to improve the accuracy of dimensioning in spite of errors resulting from runout by constantly controlling the beam deflection such that it is always equal to the runout value. This eventually results in no relative motion between the tool and the workpiece from its theoretical nominal cutting trajectory, thus mitigating the adverse affects on the dimensional accuracy of the finished workpiece. The value of beam deflection x will be a function of the contact force $F_c$ (created because of the tool runout) and the stiffness of the beam k which in turn depends on the length of the beam L as shown in Equation (26).

$$F_c = \frac{Ebh^3}{4L^3} x \qquad (26)$$

If the runout value (and the corresponding non-proportional contact force) changes during the process, the length of the beam can be adjusted so that the deflection of the beam is now equivalent to this new runout value thus maintaining the desired thickness of the slot. The runout values can be dynamically measured using Non-contact Precision Capacitance Sensors.

To prove this concept of achieving beam deflection equivalent to the runout, a ProE model of a single fixel and the workpiece along with appropriate constraints can be used (model not shown). The mesoscale size of the workpiece is chosen as 5 mm×5 mm×5 mm. A set of values of the required runouts are initially chosen. To calculate the range of values of the contact forces, a value of 8 mm is chosen for L and the expected runout is chosen (from known range of values) as 0.06 mm. Using Equation (26), the value of contact force is calculated to be in the order of 25 mN. Now, the value of the contact force is varied in the range of 20 mN to 30 mN and the values of L corresponding to a range of runouts are calculated using Equation (26). The contact force is not necessarily proportional to the runout and keeping this in mind, different combinations of contact force and runout values are chosen to calculate the L values. To validate these estimated lengths using the model, the length of the compliant beam in the model is set to one of the calculated values of L and the corresponding contact force is applied to the workpiece.

A force analysis is done on this model and the deflection of the beam can be obtained. The value of the beam deflection is then compared to the value obtained from the formula. Because the formula is obtained after making certain assumptions, these values vary by a small amount. Similar values of L were obtained for different sets of runout and contact forces and are tabulated in Table 1 which shows the possibility of achieving different runout compensation by varying the length of the compliant beam. These values of length and corresponding stiffness values may or may not be the same for the analysis under the influence of a harmonic force.

TABLE 1

Overview of the runout and length values for various trials obtained from the FE Analysis

| Runout values in mm | Runout values obtained from the ProE model | Length of the cantilever beam, L in mm |
|---|---|---|
| 0.1488 | 0.15255 | 9.999 |
| 0.1354 | 0.13903 | 9.962 |
| 0.1182 | 0.11989 | 9.742 |
| 0.0957 | 0.09795 | 9.307 |
| 0.0813 | 0.08245 | 9.053 |
| 0.0645 | 0.06642 | 8.628 |
| 0.0492 | 0.05142 | 8.137 |
| 0.0381 | 0.03647 | 7.999 |

Analysis of Fixel of FIG. 4A Under Harmonic Force

The embodiment can be further analyzed under the operation conditions of a mesoscale milling setup. Assuming that there exists runout in the tool of such a system, it results in a harmonic force F (as shown in Equation (27)) acting on the workpiece which in turn acts on the compliant beam. The frequency of this harmonic force will be equal to the frequency of spindle rotation. This setup can be modeled in MSC Adams by approximating the cantilever beams as springs with attached fixel masses which in turn are in contact with the workpiece (not shown). The rigid links which are aligned parallel to a cutting direction are modeled as constraints in this proposed model. The springs are pre-stressed such that they are always compressed thus constantly applying a force on the workpiece. This system is equivalent to an undamped system under harmonic force excitation and hence, the displacement of the workpiece will now be a function of its mass and the frequency of the harmonic force in addition to the stiffness of the fixels (e.g. cantilever beam) and the maximum amplitude of the contact force. The maximum amplitude X of the particular solution of such an undamped system under harmonic force is obtained from Equation (27) shown below, where $F_0$ is the maximum amplitude of the harmonic force, k is the stiffness of the springs (in parallel) in the system (cantilever fixels), m is the mass of the workpiece and ω is the frequency of the harmonic force.

$$F = F_0 \sin(\omega t) \quad (27)$$
$$X = \frac{F_0}{k - m\omega^2}$$

For an undamped system under a harmonic force, the phase of the particular solution is same as the phase of the harmonic force only when the ratio of the frequency of the harmonic force to the natural frequency $\omega_n$ of the system lies between 0 and 1 as shown in Equation (28).

$$0 < \omega/\omega_n < 1 \quad (28)$$

But the natural frequency of the current system is a function of the spring constant of the cantilever beam and the mass of the workpiece (ignoring fixel mass). Hence, to cancel the errors induced by the runout, the fixels must move the workpiece in phase with the runout. Therefore, the stiffness of the beam is chosen such that the natural frequency of such a system is greater than the frequency of spindle rotation.

To study the behavior of the workpiece-fixels system under a harmonic force, the Adams model can be analyzed at different spindle speeds ranging from 60000 rpm to 90000 rpm, which is the typical range of spindle speeds for a mesoscale system. The value of the runout in the tool is assumed to be in 0.0012 mm and a nominal value of 25 mN is chosen for the maximum amplitude of the harmonic contact force. It should be noted that the value of runout is chosen as 0.0012 mm since it is the least runout value usually observed in high precision systems (found in the literature) and to verify the model for this low value. The value of the harmonic force is chosen to be same as in the static analysis so that there is consistency with the previous analysis. Using Equation (27), the value of the stiffness of the compliant beam required to achieve the chosen runout value at different spindle speeds is calculated and tabulated as shown in Table 2. It is noted that the resulting design values of k per fixel depend on the number of fixels and their arrangements, yielding an equivalent k value for Equation (27).

To validate the performance of the embodiment, the frequency of the contact force in the Adams model is initially set to 60000 rpm and the value of the spring constant is set to the value from Table 2 corresponding to the spindle speed and the model is run for 0.5 seconds. For this analysis, a plot for the displacement of the center of mass of the workpiece with respect to time can be obtained. From this analysis, the system has an initial transient state for a very small duration (order of 0.01 seconds) following which the maximum amplitude of the displacement remains constant. This magnitude of the maximum amplitude is measured and is found to be 0.0012 mm which is equal to the expected runout value.

TABLE 2

Calculation of the stiffness values corresponding to different spindle speeds

| Spindle rotation speed in rpm | Maximum amplitude of the contact force in mN | Expected runout value in mm | Calculated stiffness values in N/mm |
|---|---|---|---|
| 60000 | 25 | 0.0012 | 29.645 |
| 66000 | 25 | 0.0012 | 33.683 |
| 72000 | 25 | 0.0012 | 38.106 |
| 78000 | 25 | 0.0012 | 42.913 |
| 84000 | 25 | 0.0012 | 48.105 |
| 90000 | 25 | 0.0012 | 53.681 |

A comparison of the expected runout value and the displacement of the workpiece, reveals that the displacement of the workpiece is not equal to the runout value for a small duration (close to 0.01 seconds for this example set of conditions) at the beginning of the process. But after this initial transient period, the displacement of the workpiece is equal to the expected runout value along with always being in phase with one another. Thus, the displacement of the center of mass of the workpiece is made equal to the expected runout by varying the length of the compliant beam to achieve the required stiffness values.

To analyze the workpiece-fixel system operating at various frequencies, an Adams simulation model is generated in which the frequency of the harmonic force is varied from 60000 rpm to 90000 rpm. During each of the runs, the spring constant is changed to a corresponding value as obtained from Table 2. From the Adams models, it is observed that the systems reach steady state quickly and the values of the maximum amplitude of the displacement are equal to the expected runout values in the steady state. The displacement and runout values are also in phase with another for each of the systems.

To study the error between the displacement of the center of mass of the workpiece and the expected runout value (0.0012 mm in each case) in the transient state, these parameters are plotted for each of the frequencies. From the study, it is found that the error between these two parameters varies with the frequency of the harmonic force. Also, the time the system takes to reach a constant value is also dependant on the frequency of the force. For higher values of frequencies, the system reaches steady state more quickly as compared to lower frequencies. Also, the maximum value of this error for all the frequencies is measured to be approximately 0.001 mm. Hence, higher frequencies of spindle rotation are optimal for mMT systems.

To estimate the physical size of the cantilever beams required to obtain the calculated values of spring constants, the stiffness values from Table 2 are used to calculate the corresponding lengths of the beam considering the breadth to be 1.25 mm and the width of the beam to be 0.75 mm. These values have been shown in Table 3 and it is observed from this table that the required lengths are comparable to the footprint of the mMT setup. It can also be observed from this table that since the minimum and maximum stiffness values tabulated in Table 2 are nothing but the $k_{min}$ and $k_{max}$ values respectively of this configuration of fixel of FIG. 4A, the values for length obtained in Table 3 are the corresponding $L_{max}$ and $L_{min}$ values. The ratio r of these $L_{min}$ to $L_{max}$ is calculated to be of the order of 0.8 which from previous observations is the optimum value of r for achieving maximum range of stiffness. It is also observed from the table that the slenderness ratio s (ratio of $L_{min}$ to h) for this configuration is greater than 10, thus satisfying the assumption of the embodiment. It is noted that different combinations of breadth and width of the beam and length of the beam can be used where the critical aspect is acquiring the desired fixel settings.

TABLE 3

Calculation of the lengths of the compliant beams corresponding to the beam stiffness values for Fixel of FIG. 4A

| Calculated stiffness values in N/mm | Breadth of the compliant beam in mm | Width of the compliant beam in mm | Length of the compliant beam in mm |
|---|---|---|---|
| 29.645 | 1.25 | 0.75 | 9.725 |
| 33.683 | 1.25 | 0.75 | 9.320 |
| 38.106 | 1.25 | 0.75 | 8.945 |
| 42.913 | 1.25 | 0.75 | 8.597 |
| 48.105 | 1.25 | 0.75 | 8.276 |
| 53.681 | 1.25 | 0.75 | 7.979 |

These stiffness values can also be obtained for fixel of FIG. 4B and fixed beam embodiment of FIG. 7 for the appropriate values of the parameters of the embodiments. To estimate the values of these parameters for fixel of FIG. 4B, the same stiffness values as before from Table 2 are used to calculate the corresponding widths of the beam considering the fixed length of the beam to be 10 mm and the breadth of the beam to be 1.25 mm. The thickness values have been shown in Table 4 and are comparable to the mMT setup. It is observed that, similar to fixel of FIG. 4A, the minimum and maximum values of width obtained in Table 4 represent $h_{min}$ and $h_{max}$ of the current configuration fixel of FIG. 4B. The ratio of these minimum and maximum widths is calculated to be in the order of 0.8 which again is the optimum value of r. Thus the parameters of the current configuration are the optimum values for fixel of FIG. 4B. The slenderness ratio s (ratio of L to $h_{max}$) in this case is also greater than 10.

TABLE 4

Calculation of the widths of the compliant beams corresponding to the beam stiffness values for Fixel of FIG. 4B

| Calculated stiffness values in N/mm | Breadth of the compliant beam in mm | Length of the compliant beam in mm | Width of the compliant beam in mm |
|---|---|---|---|
| 29.645 | 1.25 | 10.00 | 0.771 |
| 33.683 | 1.25 | 10.00 | 0.805 |
| 38.106 | 1.25 | 10.00 | 0.838 |
| 42.913 | 1.25 | 10.00 | 0.872 |
| 48.105 | 1.25 | 10.00 | 0.906 |
| 53.681 | 1.25 | 10.00 | 0.934 |

Similarly for fixed beam embodiment of FIG. 7, the values of the distance of the point of application of force from the fixed ends (x) required to achieve the stiffness values from Table 2 are calculated and shown in Table 5. To calculate these x values, the fixed length of the compliant beam is considered to be 5 mm, the breadth to be 0.5 mm and the width to be 0.25 mm. It is observed from Table 5 that the values of x obtained are achievable for the particular chosen configuration. Similar to the previous embodiments, the ratio r (ratio of $x_{min}$ to $x_{max}$) is same as the optimum value of 0.8 and the slenderness ratio s (ratio of L to h) is also greater than 10. Hence, by performing dynamic analysis on the fixel-workpiece system it is established that runout compensation is achievable using variable stiffness fixels (of various embodiments) for different frequencies of the spindle rotation.

TABLE 5

Calculation of distance of point of application of force from the fixed end of the compliant beams corresponding to the beam stiffness values for Fixed beam embodiment of FIG. 7

| Calculated stiffness values in N/mm | Length of the compliant beam in mm | Breadth of the compliant beam in mm | Width of the compliant beam in mm | Value of x in mm |
|---|---|---|---|---|
| 29.645 | 5.00 | 0.5 | 0.25 | 1.387 |
| 33.683 | 5.00 | 0.5 | 0.25 | 1.319 |
| 38.106 | 5.00 | 0.5 | 0.25 | 1.257 |
| 42.913 | 5.00 | 0.5 | 0.25 | 1.200 |
| 48.105 | 5.00 | 0.5 | 0.25 | 1.149 |
| 53.681 | 5.00 | 0.5 | 0.25 | 1.101 |

Compensation for Transient Dynamics

As observed previously, under the influence of harmonic force, the maximum displacement of the workpiece varies initially before reaching a constant value. This transient state exists for a very short duration but its effect on accuracy depends on the feed rate of the process. For small feed rates, the length of the workpiece machined in this small duration will not create excess inaccuracies. But in the case of high feed rates, these inaccuracies cannot be negligible. If the effects of the transient dynamics are not negligible, to counter this variation sacrificial material can be used for the initial duration of the process. The sacrificial material can be obtained by using a longer (in case of milling) or thicker (in case of drilling) workpiece and discarding the excess length/thickness after the completion of the operation.

In the determination of the appropriate fixel stiffness, the workpiece mass value will include the mass of the sacrificial material in the calculation of the length of the cantilever beam corresponding to a runout value.

While the invention has been described with reference to the exemplary embodiments thereof, those skilled in the art will be able to make various modifications to the described embodiments without departing from the true spirit and scope. The terms and descriptions used herein are set forth by way of illustration only and are not meant as limitations. In particular, although the systems have been described by examples, those skilled in the art will recognize that these and other variations are possible within the spirit and scope as defined in the following claims and their equivalents.

What is claimed is:

1. A fixturing device for supporting a workpiece, the device comprising:
    a plurality of modules for active-dynamic fixturing of the workpiece, each module comprising—
        a moveable fixture base module mounted on a support;
        a variable length compliant cantilevered beam supported by the moveable fixture base module, the beam comprising a base end, a free end, and telescoping components to increase or decrease the beam's length; and
        an interface element in contact with the workpiece and the free end of the beam for transmitting a contact force between the workpiece and the free end of the beam;
    wherein mechanical adaptability of the cantilevered beam is configured by selectively varying beam stiffness by varying beam length and width, and
    wherein the beam further comprises one or more incrementally added component strips to obtain a selected width and breadth.

2. The device of claim 1, wherein the support comprises a microscale machine tool.

3. The device of claim 1, wherein the support comprises a mesoscale machine tool.

4. The device of claim 1, wherein the plurality of modules comprise varying length cantilever beam type fixel modules.

5. The device of claim 1, wherein the multiple component strips are of the same width.

6. The device of claim 1, wherein the multiple component strips are of the same breadth.

7. The device of claim 1, wherein the plurality of component strips are of the same breadth and width.

8. The device of claim 1, wherein the moveable fixture base is configured to slide in a substantially linear direction to increase or decrease a contact force required to hold the workpiece.

9. The device of claim 8, wherein the contact force can be adjusted by modifying the stiffness of the cantilevered beam.

* * * * *